Figure 1:
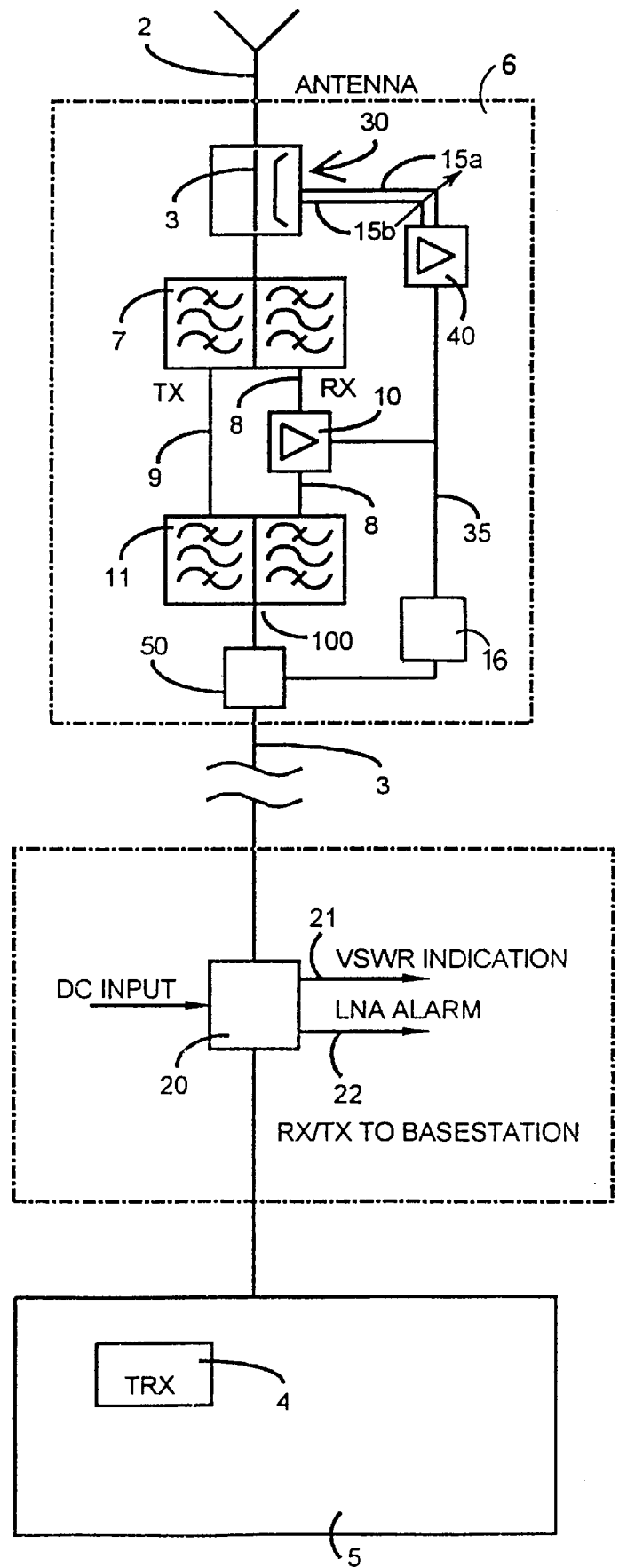

United States Patent
Oja et al.

[11] Patent Number: 6,131,020
[45] Date of Patent: Oct. 10, 2000

[54] ARRANGEMENT FOR MEASURING CONDITION OF ANTENNA IN MOBILE TELEPHONE SYSTEM

[75] Inventors: Henrik Oja, Oulu; Markku Tiihonen, Tyrnävä, both of Finland

[73] Assignee: ADC Solitra Oy, Oulu, Finland

[21] Appl. No.: 08/972,624

[22] Filed: Nov. 18, 1997

[30] Foreign Application Priority Data

Nov. 21, 1996  [FI]  Finland ..................... 964646

[51] Int. Cl.[7] .................................. H04B 17/00
[52] U.S. Cl. .............. 455/226.1; 455/67.4; 455/67.1; 455/129; 455/423
[58] Field of Search .................. 455/115, 67.1, 455/67.4, 423, 226.1, 129

[56] References Cited

U.S. PATENT DOCUMENTS

| | | | |
|---|---|---|---|
| 4,262,246 | 4/1981 | Fujii ........................................ | 324/647 |
| 4,584,650 | 4/1986 | Kozuch .................................. | 324/646 |
| 5,408,690 | 4/1995 | Ishikawa et al. ....................... | 455/115 |
| 5,548,820 | 8/1996 | Victorin ................................. | 455/67.4 |
| 5,572,510 | 11/1996 | Koivu ................................... | 370/13 |
| 5,574,981 | 11/1996 | Ahonen ................................ | 455/67.4 |
| 5,590,415 | 12/1996 | Peltola et al. ......................... | 455/115 |

FOREIGN PATENT DOCUMENTS

| | | |
|---|---|---|
| 0479168 | 4/1992 | European Pat. Off. . |
| 479168 | 4/1992 | European Pat. Off. . |
| 9416366 | 7/1994 | WIPO . |
| 9519574 | 7/1995 | WIPO . |
| 9524059 | 9/1995 | WIPO . |
| 9603844 | 2/1996 | WIPO . |

*Primary Examiner*—Dwayne D. Bost
*Assistant Examiner*—Joy Redmon
*Attorney, Agent, or Firm*—Ladas & Parry

[57] ABSTRACT

An arrangement for measuring a condition of an antenna in a mobile telephone system has a radio equipment and a transmission line connecting the radio equipment to the antenna. The transmission line has opposite end sections, whereby one of the end sections of the transmission line is closer to the antenna than the other of the end sections of the transmission line. A masthead amplifier is at the one of the end sections of the transmission line, the masthead amplifier having first and second duplex filters, an RX branch, a TX branch and an amplifier element in the RX branch, wherein the RX branch, the TX branch and the amplifier element are between the duplex filters. The standing wave ratio is measured and a measuring value calculated therefrom within the one end section of the transmission line for measuring the condition of the antenna.

18 Claims, 2 Drawing Sheets

ARRANGEMENT FOR MEASURING CONDITION OF ANTENNA IN MOBILE TELEPHONE SYSTEM

The invention relates to an arrangement for measuring the condition of an antenna in a mobile telephone system, the arrangement comprising an antenna; a transmission line; a radio equipment connected to the antenna via the transmission line and belonging to the mobile telephone system, the radio equipment being, for example, a receiver, a transmitter or a transceiver; and a masthead amplifier within that end section of the transmission line which is close to the antenna, the amplifier comprising a duplex filter, an RX branch, a TX branch, and an amplifier element in the RX branch; and the arrangement further comprising means for measuring the standing wave ratio and for calculating its measuring value; and data processing means connected with the means measuring the standing wave ratio and calculating its measuring value.

The invention also relates to an arrangement for measuring the condition of an antenna in a mobile telephone system, the arrangement comprising an antenna; a transmission line; a radio equipment connected to the antenna via the transmission line and belonging to the mobile telephone system, the radio equipment being, for example, a receiver, a transmitter or a transceiver; and means for measuring the standing wave ratio and for calculating its value; and data processing means connected with the means measuring the standing wave ratio and calculating Its measuring value.

In telecommunication systems, such as mobile telephone systems of a cellular radio network, one essential feature is the condition of the antenna. The condition of the antenna can be measured by measuring the standing wave ratio. The measuring of the standing wave ratio SWR or the voltage standing wave ratio VSWR indicates how well the antenna is electrically adapted to a radio equipment, such as a transmitter, receiver or transceiver of a telecommunications system.

In the measuring of the standing wave ratio the antenna generates a load to which a measuring transmission used in the measuring operation is directed. The standing wave ratio means the ratio of the power reflected from the antenna to the power input in the antenna. The standing wave ratio can be measured, for example, by using a directional coupler.

The prior art solutions for monitoring the condition of the antennas, for example, in cellular radio networks are such that the standing wave ratio is measured at that end of the transmission line which is close to the radio equipment, or base station, i.e. in the antenna line, either inside the actual base station or in the coaxial connector of a long antenna cable extending to the antenna on the side of the base station. The known solutions contain many problems, for the measuring sensitivity is greatly impaired by the fact that the transmission line from the base station at the ground level is often rather long to the antenna situated high up the antenna mast. If the system is one in which the antenna mast comprises a masthead amplifier that comprises a duplexer, it is extremely difficult to make a reliable measurement of the value of the standing wave ratio.

FI 92,259 teaches a measuring arrangement in which samples are taken at the upper end of the transmission line, i.e. "up" the antenna line, and the samples are transferred via the transmission line "down" to the data processing means. The above problems, however, cannot be avoided by this solution, since the value of the standing wave ratio is calculated "down", i.e. at the lower end of the transmission line, whereas "up", i.e. at that end of the transmission line which is close to the antenna, samples are only measured from the signal of the antenna line. Another problem of the solution is that a separate signal for measuring excitation transmitted at a different frequency has to be used, and the signal has to be converted back to the normal operating frequency for the duration of the measurement in connection with the antenna.

The object of the present invention is to provide a new type of arrangement in which the problems involved in the known solutions are avoided.

The object is achieved with an arrangement according to the invention, which is characterized in that the means for measuring the standing wave ratio and calculating its measuring value are arranged to make the measurement and calculate the measuring value within that end section of the transmission line which is close to the antenna.

Major advantages are achieved with the solution of the invention, in particular, the measuring sensitivity is greatly improved. As regards the equipment needed, the solution is also simple to implement, and it is fairly cost-effective. The solution is also structurally integrated, for the standing wave ratio measurement and calculation can be integrated into the masthead amplifier, which precedes the actual antenna in the antenna mast. The high degree of integration makes the installation and servicing operations easier for the teleoperator, who operates the cellular network, to carry out.

Figure 2:
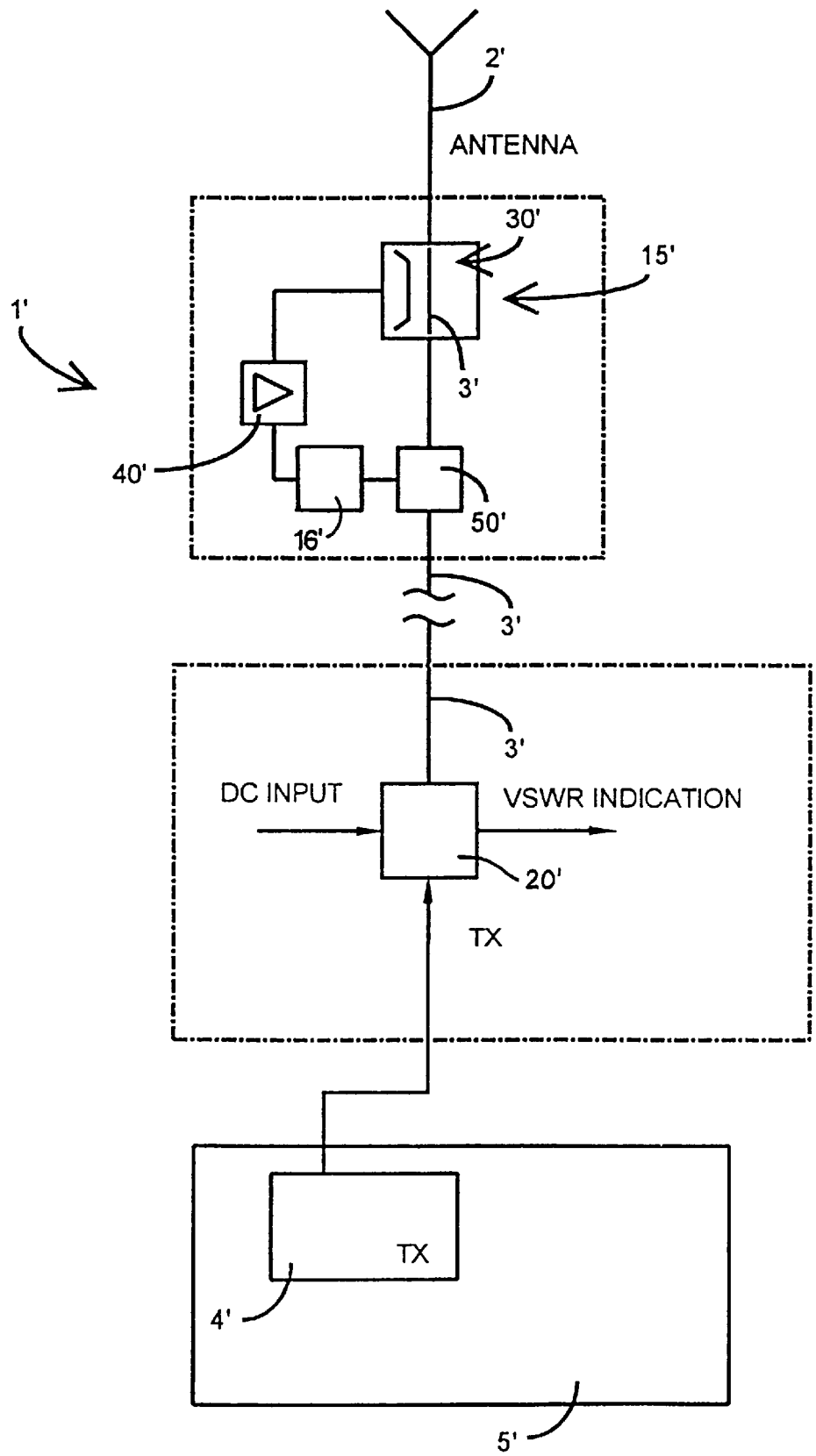

In the following the invention will be described in greater detail with reference to the attached drawings, in which FIG. 1 shows a first preferred embodiment of the invention, and FIG. 2 shows a second preferred embodiment of the invention.

FIG. 1 shows an arrangement 1 for measuring the condition of an antenna in a mobile telephone system.

The arrangement 1 comprises an antenna 2; a transmission line 3; a radio equipment 4 connected to the antenna 2 via the transmission line and belonging to the mobile telephone system, the radio equipment being, for example, a receiver, a transmitter or a transceiver 4. Reference number 5 in FIG. 1 indicates a base station 5 belonging to the mobile telephone system and comprising the abovementoned radio equipment 4, or, for example, transceiver 4.

The arrangement 1 for measuring the condition of the antenna also comprises a masthead amplifier 6 in the transmission line 3, either at that end of the transmission line which is close to the antenna or, in general, within that end section of the transmission line which is close to the antenna. The masthead amplifier 6 is therefore here understood as belonging to the transmission line. In FIG. 1 the masthead amplifier is the last part of the transmission line. There may even be a cable section between the antenna and the masthead amplifier.

The masthead amplifier 6 comprises a duplexer filter 7, an RX branch 8, a TX branch 9, and an amplifier element 10 in the RX branch. In the preferred embodiment of FIG. 1, the masthead amplifier 6 also comprises a second duplexer filter 11 in addition to the above-mentioned duplexer filter 7. The RX branch 8, TX branch 9 and the amplifier element 10 amplifying the RX branch 8 are between the duplexer filters 7 and 11. A received uplink signal, i.e. a signal transmitted from a mobile phone to a base station, is amplified in a manner known per se by means of the signal-amplifying amplifier element of the RX branch.

When FIG. 1 is studied in the direction from the antenna 2 toward the radio equipment 4, duplexer filter 7 functions as a dividing filter forming the RX and TX branches 8 and 9, and the second duplexer filter 11 functions as a filter that combines the TX branch and the amplified RX branch. In the reverse direction, i.e. toward the antenna 2, the situation is naturally reverse: filter 11 can be thought to be a dividing filter, and filter 7 can be thought to be a combining filter.

The solution does not necessarily comprise the second filter, i.e. in the direction toward the radio equipment the filter 11 that can be thought of as a combining filter can be lacking. The use of the combining filter 11, however, simplifies the cabling, since two transmission lines are not needed in the direction from the masthead amplifier downward to the transceiver of the cellular network.

In addition, the arrangement 1 for measuring the condition of the antenna comprises means 15, 16 for measuring the standing wave ratio and for calculating the measuring value, and data processing means 20 connected with the means 15, 16 measuring the standing wave ratio and calculating its value.

The data processing means 20 receive a measuring value from the means 15, 16 measuring the standing wave ratio and calculating its value, and from the measured SWR or VSWR value the data processing unit 20 concludes whether the standing wave ratio is too high. The data processing unit 20 comprises an alarm output 21 from which an alarm is outputted. The unit can also comprise other alarm outputs, such as an alarm output 22 which announces whether or not the amplifier of the RX branch is in working order.

Preferably the data processing means 20 connected with the means 15, 16 measuring the standing wave ratio SWR, VSWR and calculating its measuring value are a separate part external of the masthead amplifier 6, located far from the masthead amplifier 6 and close to the radio equipment 4.

If the standing wave ratio SWR, VSWR is too high, then most of the power reflects back from the antenna. The Applicant has observed that the VSWR has to be lower than 1.5. If the ratio is higher than 1.5, then there is something wrong with the impedance adaptation between the antenna and the rest of the system, or they can also be something else wrong with the antenna It is essential to the invention that the means 15, 16 for measuring the standing wave ratio SWR, VSWR and for calculating the measuring value are arranged to make the measurement and calculation within that end section of the transmission line 3 which is close to the antenna.

There can also be a cable section, i.e. a length of a transmission line, between the antenna 2 and the masthead amplifier 6, but even then the standing wave ratio is measured within the end section of the actual transmission line.

In the preferred embodiment of FIG. 1, the solution is such that the means 15, 16 for measuring the standing wave ratio SWR, VSWR and for calculating the measuring value are arranged to make the measurement and calculation at a point between duplex filter 7 and the antenna 2, at that end of the transmission line 3 which is close to the antenna. In the preferred embodiment of FIG. 1, the solution Is such that the means for measuring the standing wave ratio are arranged to make the measurement inside the masthead amplifier at the point between the duplex filter and the antenna, at that end of the transmission line 3 which is close to the antenna, whereby the solution provides a compact entity with a high degree of integration, since the measuring means and calculation means 15, 16 measuring the standing wave ratio are then an integral part of the masthead amplifier. In any case, the means 15, 16 for measuring the standing wave ratio and for calculating the value are arranged in connection with or in the immediate vicinity of the masthead amplifier 6, but preferably they are an integral part of the masthead amplifier 6.

The measuring and calculation means 15, 16 are most preferably implemented, for example, as a measuring means 15, 15a, 15b of a directional coupler type and as a calculation unit 16.

When the standing wave ratio is measured, as a signal for measuring excitation is used a normal signal obtained from the radio equipment 4, i.e. for example from the transmitter 4 of the base station 5 or some other normal signal even otherwise involved in the operation of the mobile telephone system.

As the standing wave ratio is measured, the SWR measuring means 15, i.e. directional couplers 15a, 15b, are coupled at coupling point 30 to the transmission line 3 at the end section of the line, preferably without a galvanic coupling. The example of FIG. 1 illustrates a situation where the measuring means are coupled to the end of the transmission line, for the masthead amplifier forms the extreme parts of the transmission line 3 between the antenna 2 and the radio equipment 4 (e.g. base station transceiver).

The measuring means 15 comprise a first part 15a for measuring the power reflected from the antenna, and a second part 15b for measuring the power inputted in the antenna. From the measuring means 15 are outputted two signals in an auxiliary coupling line 35. In some embodiments it is also possible to use a one-part directional coupler, but the Applicant has observed that the above-described two-part coupler is better. On the basis of the measurements made by the measuring means 15 the calculation unit 16 calculates the value of the standing wave ratio.

In a preferred embodiment of the invention, the arrangement, preferably a masthead amplifier 6 comprises a measuring amplifier 40 connected with the means 15 measuring the standing wave ratio. Through the measuring amplifier the measuring data can be transferred toward the data processing means 20.

When the measuring amplifier 40 is implemented as a part of the masthead amplifier 6, an even higher degree of integration is achieved, and it is also ensured that the signal strength is maintained sufficiently high so that the data processing unit 20 at the other end of the transmission line, even a long cable-distance away, can detect an amplified measuring signal.

The arrangement also comprises a coupling point 50. According to a preferred embodiment of the invention the arrangement is such that the measuring information on the standing wave ratio, i.e. in practice the output of the measuring amplifier 40, is fed to the transmission line at the coupling point 50 of the arrangement so as to transfer the measuring information to the data processing means particularly along the transmission line concerned.

The coupling point 50 is preferably inside the masthead amplifier 6, so in the preferred embodiment illustrated in FIG. 1, the arrangement is such that the measuring information on the standing wave ratio is fed to the transmission line at the coupling point of the masthead amplifier so as to transfer the measuring information to the data processing means along the transmission line. The solution further improves the degree of integration.

FIG. 1 shows that the coupling point 50 for feeding the measuring information to the transmission line is connected with that output/input of the second duplex filter which is connected with the data processing unit 20 and either directly or through the unit to the radio equipment 4.

Reverting now to matters concerning the coupling point 50 and the measuring amplifier 40, the arrangement is preferably such that the masthead amplifier 6 comprises a measuring amplifier connected with the means 15 measuring the standing wave ratio SWR, VSWR. The measuring information an be fed to the transmission line 3 through the amplifier at the coupling point 50, and forwarded to the data processing means 20 and through them, or directly, to the radio equipment 4.

FIG. 2 illustrates a second preferred embodiment of the invention. In FIG. 2, no masthead amplifier is used. The arrangement of FIG. 2, like the one of FIG. 1, is an arrangement for measuring the condition of an antenna in a mobile telephone system. The arrangement 1' comprises an antenna 2'; a transmission line 3'; a radio equipment 4' connected to the antenna via the transmission fine 3' and belonging to the mobile telephone system, the radio equipment being, for example, a receiver, a transmitter or transceiver; and means 15', 16' for measuring the standing wave ratio and calculating the value. The arrangement 1' further comprises data processing means 20' connected with the means 15', 16' measuring the standing wave ratio SWR, VSWR and calculating its value.

The essential feature in the arrangement of FIG. 2 is that the means 15', 16' for measuring the standing wave ratio and for calculating its value are arranged to make the measurement and calculation at that end of the transmission line 3' which is close to the antenna. The arrangement of FIG. 2, like the one of FIG. 1, comprises a measuring amplifier 40' connected with the means 15' measuring the standing wave ratio; the measuring information, i.e. the measuring result or measuring value obtained from the calculation means 16', being transferable through the measuring amplifier toward data processing means 20', preferably via the transmission line 3' itself through the coupling point between the measuring amplifier and the transmission line. Similarly as in FIG. 1, the solution of FIG. 2 is such that the measuring value of the standing wave ratio is fed to the transmission line 3' at the coupling point 50' of the arrangement so as to transfer the measuring value or result to the data processing means, particularly along the transmission line concerned. No separate additional cabling is then needed to supply the SWR measuring information to the data processing means 20'.

Although the invention is described above with reference to the examples illustrated in the attached drawings, the invention is not to be construed as being limited to them but can be varied in many ways without deviating from the inventive idea disclosed in the attached claims.

What is claimed is:

1. In an arrangement for measuring a condition of an antenna in a mobile telephone system, the arrangement having a radio equipment and means including a transmission line connecting the radio equipment to the antenna, the transmission line having opposite end sections, whereby one of the end sections of the transmission line is closer to the antenna than the other of the end sections of the transmission line, the improvements comprising:

a masthead amplifier at the one of the end sections of the transmission line, the masthead amplifier having first and second duplex filters, an RX branch, a TX branch and an amplifier element in the RX branch, wherein the RX branch, the TX branch and the amplifier element are between the duplex filters;

means for measuring the standing wave ratio and for calculating a measuring value therefrom, wherein the measuring is made within the one end section of the transmission line; and data processing means responsive to the means for measuring the standing wave ratio and for calculating its measuring value for measuring the condition of the antenna.

2. An arrangement according to claim 1, wherein that the calculated measuring value of the standing wave ratio is fed to the transmission line at a coupling point of the arrangement so as to transfer the calculated measuring value to data processing means, particularly along said transmission line.

3. An arrangement according to claim 1, wherein the calculated measuring value of the standing wave ratio is fed to the transmission line at the coupling point contained in the masthead amplifier of the arrangement so as to transfer the measuring value to the data processing means along the transmission line.

4. An arrangement according to claim 1, wherein, in the direction from the antenna to the radio equipment, said duplex filter functions as a dividing filter, which forms the RX and TX branches, and said second duplex filter functions as a filter combining the TX branch and the amplified RX branch.

5. An arrangement according to claim 1, wherein the masthead amplifier comprises a measuring amplifier connected with the means measuring the standing wave ratio and calculating its measuring value.

6. An arrangement according to claim 1, wherein the data processing means connected with the means measuring the standing wave ratio and calculating its measuring value are a separate part external of the masthead amplifier, far from the masthead amplifier and close to the radio equipment.

7. An arrangement according to claim 1, wherein the calculated measuring value of the standing wave ratio is fed to the transmission line at the coupling point of the arrangement so as to transfer the calculated measuring value to the data processing means, particularly along said transmission line.

8. An arrangement according to claim 1, wherein the arrangement comprises a measuring amplifier connected with the means measuring the standing wave ratio and calculating its measuring value, the measuring value being transferable toward the data processing means, preferably via the transmission line itself through the coupling point between the measuring amplifier and the transmission line.

9. An arrangement according to claim 1, wherein the mobile telephone system is a cellular radio network.

10. An arrangement according to claim 1, wherein the radio equipment is a transmitter, a receiver or a transceiver of a base station in the mobile telephone system.

11. An arrangement according to claim 1, wherein the means for measuring the standing wave ratio and for calculating its value are arranged to make the measurement and to calculate the value at or slightly before the end of that section of the transmission line which is close to the antenna.

12. An arrangement according to claim 1, wherein the means for measuring the standing wave ratio and for calculating its value are arranged to make the measurement and calculation from the ratio of the power reflected from the antenna to the power inputted in the antenna.

13. An arrangement according to claim 1, wherein as a signal for measuring excitation is used a normal transmission signal or some other signal that is even otherwise involved in the operation of the mobile telephone system and is obtained from the radio equipment.

14. An arrangement according to claim 1, wherein the calculated measuring value indicating the standing wave ratio is supplied via the transmission line to the data processing means.

15. An arrangement according to claim 1, wherein the means for measuring the standing wave ratio and for calculating its value are arranged to make the measurement at a point between the duplex filter and the antenna at that end of the transmission line which is close to the antenna.

16. An arrangement according to claim 6, wherein the means for measuring the standing wave ratio and for calculating its value are arranged to make the measurement at or, preferably, inside the masthead amplifier at the point between the duplex filter and the antenna at that end of the transmission line which is close to the antenna, the means measuring the standing wave ratio and calculating its value thus being part of or closely connected with the masthead amplifier.

17. An arrangement according to claim 2, wherein, to feed the calculated measuring value to the transmission line, said coupling point (50) is connected with that output/input of said second duplex filter which is connected to the radio equipment via the transmission line.

18. An arrangement according to claim 2, wherein the masthead amplifier comprises a measuring amplifier connected with the means measuring the standing wave ratio and calculating its measuring value, the measuring value being transferable at said coupling point to the transmission line and further to the data processing means.

* * * * *